United States Patent [19]
Maeda et al.

[11] Patent Number: 5,569,499
[45] Date of Patent: Oct. 29, 1996

[54] METHOD FOR REFORMING INSULATING FILM

[75] Inventors: Kazuo Maeda; Noboru Tokumasu; Yoshiaki Yuyama, all of Tokyo, Japan

[73] Assignees: Semiconductor Process Laboratory Co., Ltd.; Canon Sales Co., Inc.; Alcan-Tech Co., Inc., all of, Japan

[21] Appl. No.: 331,736

[22] Filed: Oct. 31, 1994

[30] Foreign Application Priority Data

Nov. 10, 1993 [JP] Japan .................................. 5-281158

[51] Int. Cl.$^6$ ............................. H05H 1/00; H05H 1/24; C23C 16/00
[52] U.S. Cl. .................. 427/539; 427/535; 427/579; 427/255.3
[58] Field of Search .................................. 427/535, 539, 427/536, 255.3, 573, 574, 579, 534

[56] References Cited

U.S. PATENT DOCUMENTS

| | | | |
|---|---|---|---|
| 4,105,810 | 8/1978 | Yamazaki et al. | 427/255.3 |
| 4,279,654 | 7/1981 | Yajima et al. | 427/376.2 |
| 4,493,855 | 1/1985 | Sachdev et al. | 427/534 |
| 4,634,496 | 1/1987 | Mase et al. | 427/534 |
| 4,683,024 | 7/1987 | Miller et al. | 427/534 |
| 4,906,592 | 3/1990 | Merenda et al. | 427/534 |
| 5,104,482 | 3/1992 | Monkowski et al. | 427/255.3 |
| 5,270,267 | 12/1993 | Ouellet | 427/535 |
| 5,281,295 | 1/1994 | Maeda et al. | 156/345 |
| 5,314,724 | 5/1994 | Tsunkune et al. | 427/535 |
| 5,387,546 | 2/1995 | Maeda et al. | 427/582 |

*Primary Examiner*—Marianne Padgett
*Attorney, Agent, or Firm*—Lorusso & Loud

[57] ABSTRACT

A method for reforming an insulating film such as a BSG film formed by a CVD technique. The method reduces the parasitic capacitance between conductor layers having an intervening film, especially a BSG film, and includes the steps of depositing a BSG film on a substrate from a gaseous source and exposing the BSG film to a reforming gas plasma.

10 Claims, 6 Drawing Sheets

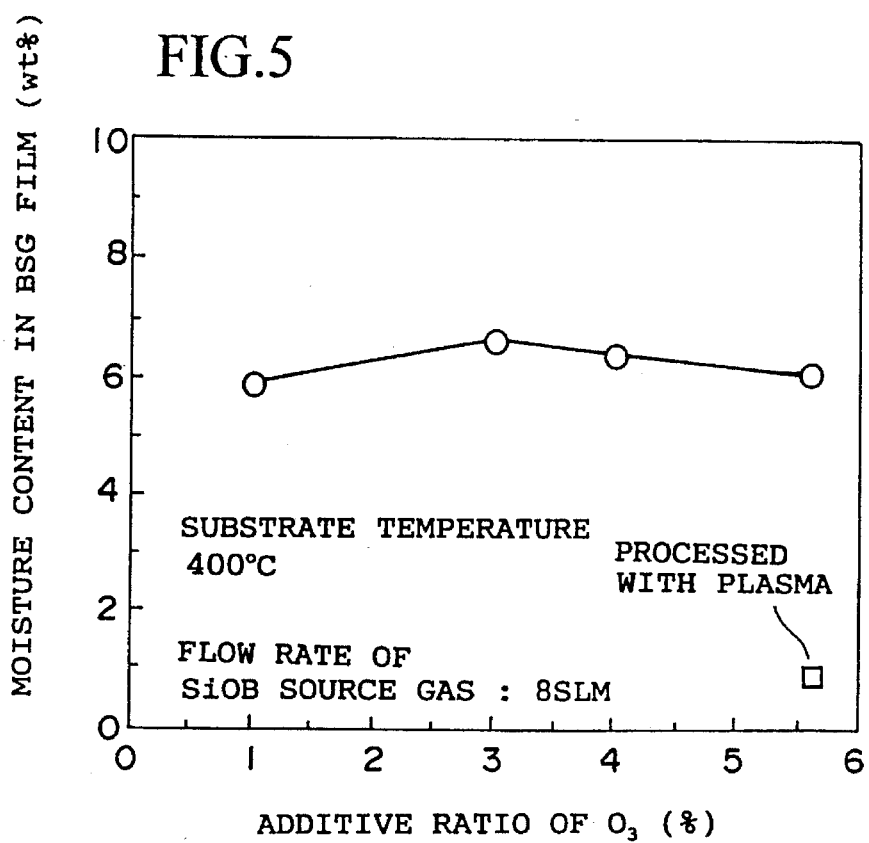
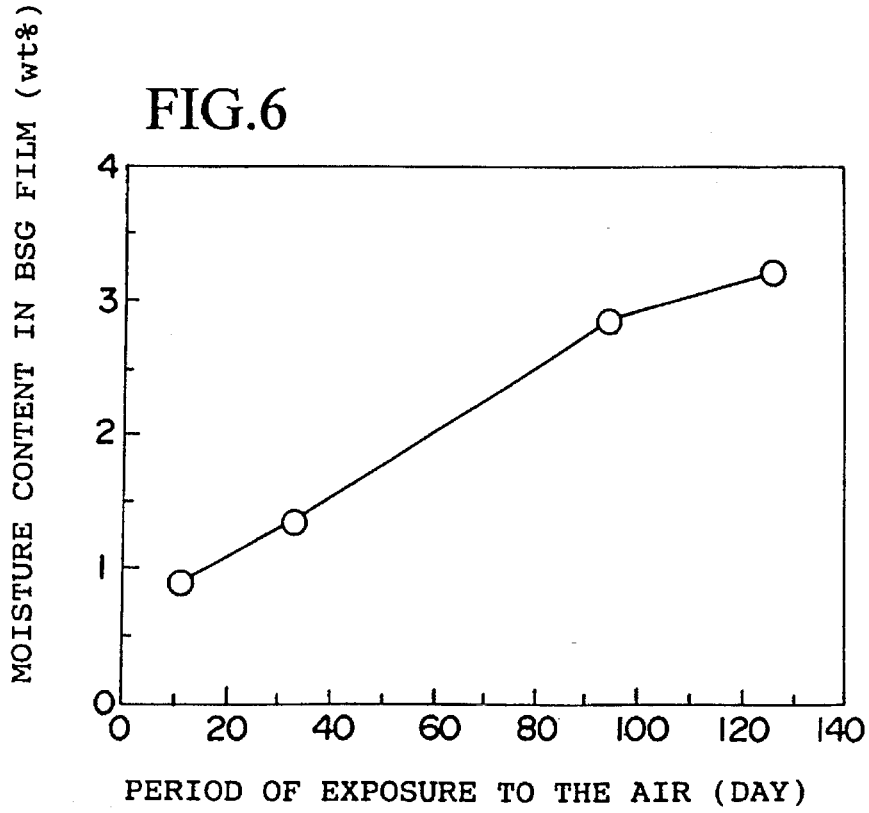

FIG.8
| No. | SiOB SOURCE | Si/B RATIO |
|---|---|---|
| 1 | (R$_3$SiO)$_3$B<br>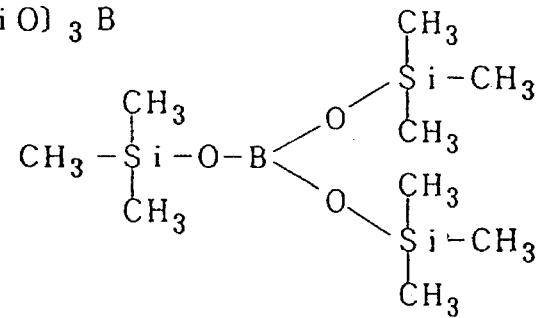 | $\dfrac{Si}{B}=\dfrac{3}{1}=3$ |
| 2 | (R$_3$SiO)$_2$BOB(OSiR$_3$)$_2$<br>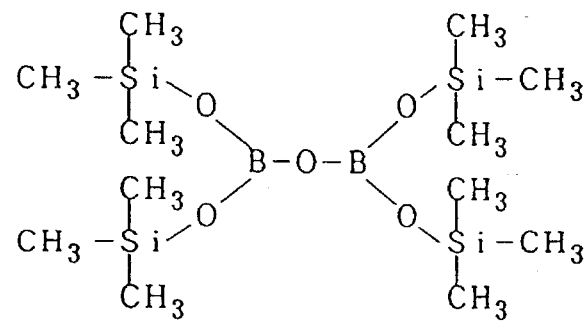 | $\dfrac{Si}{B}=\dfrac{4}{2}=2$ |
| 3 | (R$_3$SiO)$_2$BOSiR$_2$OB(OSiR$_3$)$_2$<br>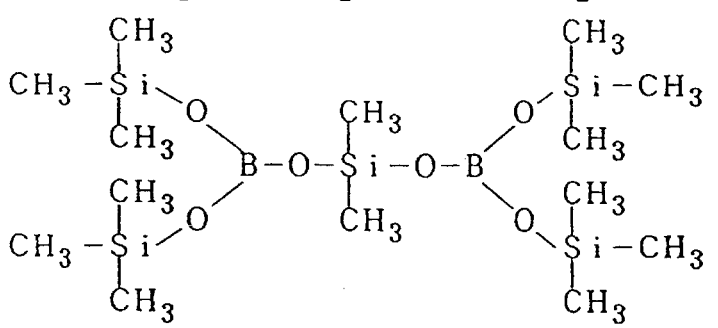 | $\dfrac{Si}{B}=\dfrac{5}{2}=2.5$ |
| 4 | (R$_3$SiO)$_2$BR<br>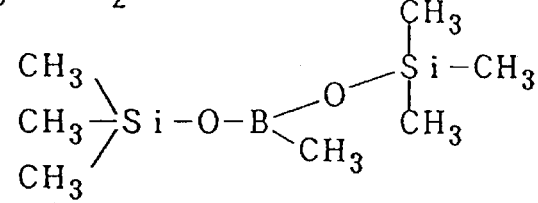 | $\dfrac{Si}{B}=\dfrac{2}{1}=2$ |
| 5 | (R$_3$SiO)BR$_2$<br>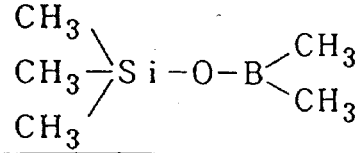 | $\dfrac{Si}{B}=\dfrac{1}{1}=1$ |

METHOD FOR REFORMING INSULATING FILM

BACKGROUND OF THE INVENTION

1. Field of the Invention

The invention relates to a method for reforming an insulating borosilicate glass film (hereinafter, referred to as "BSG film") formed by a CVD technique.

2. Description of the Prior Art

Most of inter-layer insulating films used for semiconductor devices are of $SiO_2$ or $SiO_2$-based materials. Such insulating films of $SiO_2$ have a relative permittivity of 4.0 (measured at a frequency of 1 MHz). The capacitance between the conductor layers with an insulating film between is determined according to the equation:

$$C = \epsilon_0 \cdot \epsilon \cdot A/t$$

where
- $\epsilon_0$ = the permittivity of the vacuum
- $\epsilon$ = relative permittivity of the insulating film
- A = for purposes of calculation, the area of the facing or overlapping parts of conductor layers between which the insulating film is located. However, contributions from portions other than the facing or overlapping portion of the conductor layers should be taken into account.
- t = distance between the conductor layers where the insulating film intervenes.

Though parasitic capacitance is inevitable in any semiconductor device, an excessively large value of parasitic capacitance will result in crosstalk between conductor layers or delay of signal propagation. Particularly, when a multilayer metalized structure is used in order to improve integration of a semiconductor device, overlapping or facing areas of conductors are increased. This increase results in increase of the parasitic capacitance. Also, the smaller the scale of the patterns is, the smaller is the spacing between adjacent conductors. When the spacing between adjacent conductors becomes smaller than that between the upper and lower conductors, the parasitic capacitance will increase to the extent of producing a significant affect on the device characteristics.

Reduction of the parasitic capactance requires a reduction in the relative permittivity ($\epsilon$) of the insulating films between the conductor layers. For this purpose, the following approaches have been taken:

(1) Use of $SiO_2$ films containing Si—F bonds or F. For films formed by hydrolysis of an organic silicon compound containing F, an $\epsilon$ of 3.7 has been reported. Where the silicon oxide film containing F is formed by means of a plasma CVD technique, using a gas mixture consisting of $C_2F_6$. and TEOS (tetraethyl orthosilicate), a low relative permittivity has been reported.

(2) Use of organic resin films of TEFLON™. A value of less than 3.0 has been reported.

(4) Use of SiDBN films or SiOBN films formed by sputtering.

However, in case of (1), it is not yet sufficiently clear what kind of bad affects on the device characteristics are produced by the use of insulating films containing Si—F bonds or F.

In case of (2) and (3), the insulating films comprise a substance completely different from $SiO_2$. It is doubtful whether or not such insulating films are practical.

Also, in case of (4), since the insulating films are not stable, they are not suitable for application as semiconductor devices.

SUMMARY OF THE INVENTION

It is an object of the invention to provide a method for reforming insulating films to reduce the parasitic capacitance between the conductor layers separated by an insulating film, especially a BSG film.

The present invention avoids $SiO_2$ materials containing Si—F bonds or F because the affect of Si—F bonds or F on the device characteristics is not yet sufficiently clear.

The present invention is based on discovery of a correlation between the quantity of moisture in a borosilicate glass (BSG) film and the relative permittivity. For example, a BSG film increases in relative permittivity upon being left in the air. This suggests that the increase of the relative permittivity is related to an increase of the quantity of moisture contained in the BSG film and that, accordingly, the relative permittivity can be reduced by reducing the quantity of moisture in the BSG film.

Through experimentation it has been found that the exposure of the BSG film to a plasma of a reforming gas such as oxygen, ammonia or inert gas leads to reduction of the quantity of moisture contained in the BSG film, thereby resulting in a reduction of the relative permittivity of the film. It has also been found that change in the quantity of moisture in the BSG film upon standing becomes extremely small after exposure to a plasma.

According to the present invention, the performance of BSG films is improved by exposing BSG films to a plasma of a reforming gas so that the relative permittivity is reduced by decreasing the quantity of moisture contained in the BSG films, and the BSG films, by the plasma treatment, are prevented from reabsorbing moisture.

Also, elevating the substrate temperature during exposure to a plasma increases the beneficial effect of reforming the film. Additionally, this plasma treatment is also beneficial in processing an interlayer insulating film covering an interconnection layer of Al etc., because a low temperature less than 500° C. is sufficient for reforming.

Particularly, when the plasma processing of the present invention is applied to a BSG film which has been formed using a gas mixture consisting of an organic metal compound containing Si—O—B bonds and ozone as a deposition gas, the effect of reduction in the relative permittivity of the BSG film is increased. This is because Si—O—B bonds have been introduced as is into the BSG film just after deposition of the BSG film and, as a consequence, the BSG film has high density and low hygroscopicity.

Moreover, since a BSG film which contains Si—O—B bonds introduced immediately after deposition can be formed even when the depositing temperature is as low as 400° C. or lower, the application to semiconductor devices is possible without restriction of the manufacturing process.

It should be noted that the boron content of the BSG film can be finely adjusted by use of tetraethyl orthosilicate in the depositing gas.

BRIEF DESCRIPTION OF THE DRAWINGS

FIG. 5 is a characteristic graph showing how the moisture content of the BSG film just after deposition depends on the percentage of $O_3$ based on $O_2$ and showing the moisture content of the BSG film after plasma treatment according to an embodiment of the invention;

FIG. 8 is a table listing exemplary SiOB source gases which can be utilized in the present invention.

DESCRIPTION OF THE PREFERRED EMBODIMENT (1) A method for reforming BSG films according to an embodiment of the invention A method for reforming BSG films according to an embodiment of the invention is now explained referring to FIG. 1 and FIG. 2(a), 2(b), 2(c), and 2(d). FIG. 1 is a sectional view showing a BSG film exposed to a plasma of a reforming gas. FIGS. 2(a), 2(b), 2(c), and 2(d) are sectional views illustrating a series of steps of forming a BSG film 14 as an interlayer insulating film covering a lower conductor layer 13, and reforming it by plasma irradiation.

A gas containing an organic metal compound of silicon (Si), boron (B), and oxygen (O), (hereinafter, referred to as an SiOB source), is used as a deposition gas.

The SiOB source may be for example, an organic metal compound with Si—O—B bonds which is represented by the general formula:

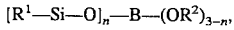

where n=1, 2, . . . , and each of $R^1$ and $R^2$ denotes an alkyl group, aryl group or any analogous organic group. An alkyl group is an atomic group remaining when a hydrogen atom has been removed from a paraffin hydrocarbon. It is represented by the general formula of $C_nH_{x\ n+1}$. A methyl group ($CH_3$) and an ethyl group $C_2H_5$) are two examples. "Aryl" is a general term for a group remaining when a hydrogen atom has been removed from an aromatic hydrocarbon, and a phenyl group ($C_6H_5$) is one example. FIG. 8 shows exemplary SiOB Sources.

Tristrimethylsilylborate represented by the structural formula:

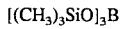

in admixture with ozone ($O_3$) is particularly useful as a deposition gas.

Figure 2A:
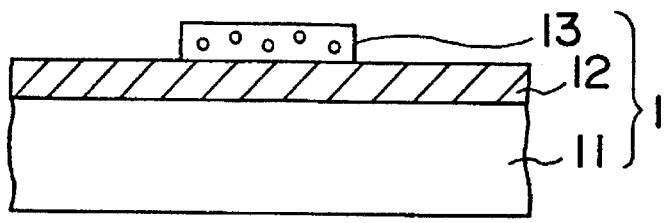
FIGS. 2(a), 2(b), 2(c), and 2(d) are sectional views illustrating a process including the deposition and the reforming of a BSG film according to an embodiment of the invention.

First, a wafer 1 is placed on a wafer holder in a reaction chamber of an atmospheric pressure CVD system and is heated, for example, by a built-in heater within the wafer holder so as to be kept at a temperature under 400° C. As shown in FIG.2(a), the wafer 1 includes an insulating film 12, in the form of a silicon oxide film, formed on a semiconductor substrate 11, with a lower conductor layer 13 consisting of an Al film covering the insulating film 12.

Then, a deposition gas is introduced into the reaction chamber. The deposition gas is a mixture of a SiOB source gas and $O_3$. The SiOB source gas consists of a carrier gas such as $N_2$ containing $[(CH_3)_3SiO]_3B$ and is introduced at 7 SLM. The $O_3$ gas is 6% in $O_2$.

Figure 2B:
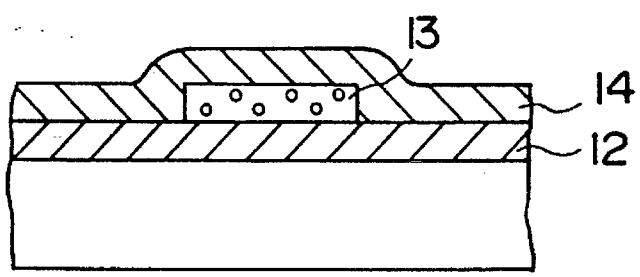

By maintaining this condition for 3 minutes, a BSG film 14 with a thickness of 1.1 µm is deposited on the wafer 1 as shown in FIG. 2(b). Since the temperature of the wafer 1 is at 400° C. or lower, it is possible to deposit an interlayer insulating film on a lower conductor layer 13 of Al film without causing the Al film to suffer large thermal distortions.

Figure 1:
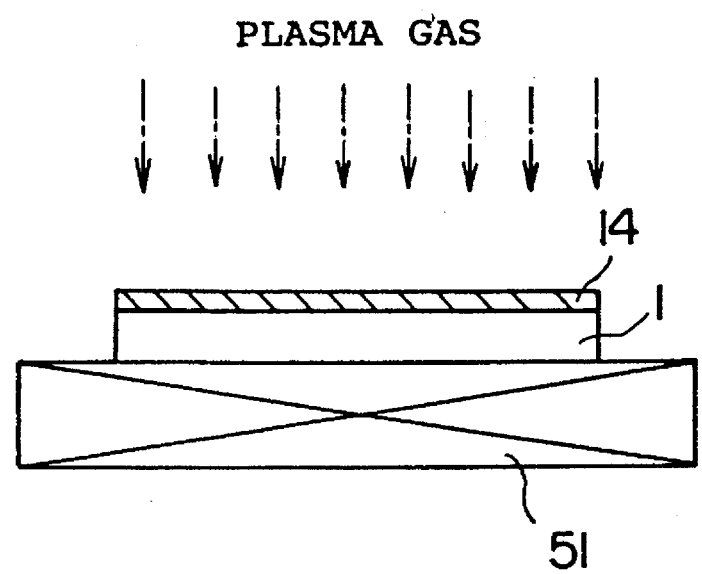
FIG. 1 is a schematic sectional view illustrating a method for reforming BSG films according to an embodiment of the invention.
Figure 2C:
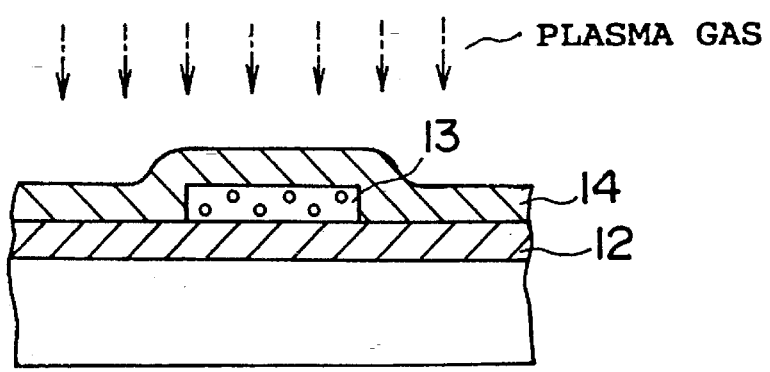

Next, the wafer on which a BSG film 14 has been deposited is set on a wafer holder 51 shown in FIG. 1 in a chamber of a parallel plate plasma CVD system. The pressure in the chamber being reduced, the wafer 1 is heated by a heater installed in the wafer holder 51 so as to be kept at 500° C. or lower. After a reforming gas of at least one member, selected from the group consisting of oxygen, ammonia and inert gas, has been introduced into the chamber at a predetermined flow rate to maintain the pressure at about 1.0 Torr or lower, RF power below 600 W and at a frequency from 100 KHz to 13.56 MHz is applied between the parallel plates to convert the reforming gas into plasma. Thus, the BSG film 14 is exposed to the plasma of the reforming gas as shown in FIG. 2(c). After keeping this condition for 1 through 5 minutes, the BSG film is reformed to reduce its relative permittivity.

Figure 2D:
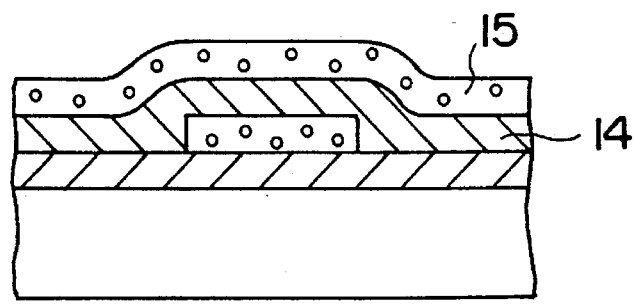

Then, an upper conductor layer 15 of an Al film etc. is further formed on the BSG film 14 as shown in FIG. 2(d).

Results of experiments to determine other characteristics of the BSG film 14 will now be explained. The BSG film 14 has been formed from a gas mixture of an SiOB Source and $O_3$ but has not yet been processed with a plasma.

15 to 18 mol % (equivalent to 5 through 6 wt. %) of boron is contained in the BSG film 14 formed as described above. The Si/B ratio of the SiOB source was 3, and the B content of the BSG film 14 was nearly equal to the theoretical value.

Thus, the B content of a BSG film 14 is substantially determined by the Si/B ratio of the SiOB source, whereby B can be controllably doped to a precise concentration. It is noted that further fine adjustment of the B content is also achieved by adding tetraethyl orthosilicate (TEOS) to the above-described deposition gas.

A BSG film formed by a conventional deposition method would have notably absorbed moisture immediately after deposition to form a cloud on its surface, whereas, in the case of the above-described embodiment, the BSG film was so stable that moisture absorption was not observed upon exposure to the air for a short time. Even after the BSG film had been exposed to the air for a long time, no change was observed on the surface of the film. This is because firm Si—O—B bonds are formed in the BSG film to improve the denseness of the film and thereby prevent the absorption of moisture.

A BSG film 14 according to the embodiment described above not only has a stable surface and good performance, but also has high resistance to cracking. For example, such a BSG film, even 3 µm in thickness, was free of cracks.

Also, according to the invention, the BSG film grows in an isotropic manner and therefore is very superior in step coverage.

As described above, Si—O—B bonds have been introduced as components as they are into as-depo BSG film 14 formed using a gas mixture consisting of a SiOB source and ozone ($O_3$). Therefore, the as-depo BSG film 14 has a glass structure and hence high denseness and low hygroscopicity.

Further, the use of $O_3$ raises the resolvability of a SiOB source so that a BSG film 14, which received Si—O—B bonds just after deposition, can be formed even when the wafer 1 is held at a low temperature below 400° C. Therefore, the method of the invention can be applied to semiconductor devices without restrictions on the manufacturing process.

Figure 3:
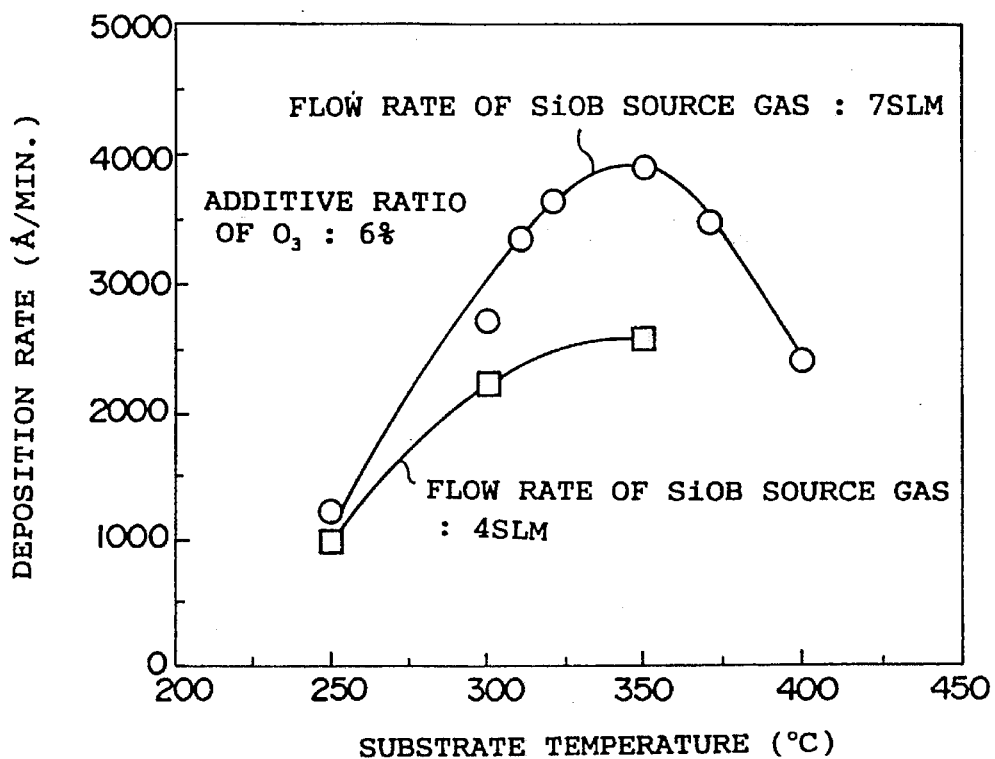
FIG. 3 is a characteristic graph of deposition rate of the BSG film formed by a CVD technique, using a gas mixture consisting of a SiOB source and $O_3$, versus the substrate temperature, according to an embodiment of the invention.
Figure 4:
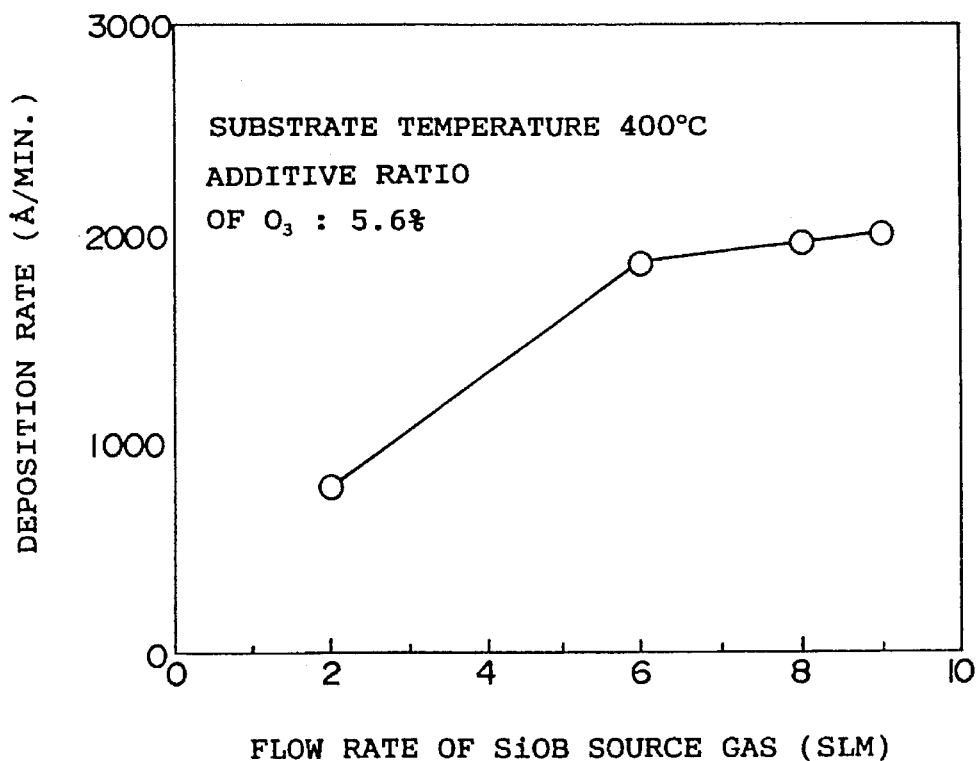
FIG. 4 is a characteristic graph of deposition rate of the BSG film, formed by a CVD technique using a gas mixture consisting of SiOB source and $O_3$, versus the flow rate of a SiOB source gas according to an embodiment of the invention.

FIGS. 3 and 4 show deposition data for a BSG film formed by the deposition method described above.

FIG. 3 shows the dependence of the deposition rate upon the substrate temperature during deposition (depositing temperature). The abscissa indicates the substrate temperature (° C.) and the ordinate indicates the deposition rate (Å/minute). Here are shown experimental data for the dependence of the deposition rate upon the substrate temperature ranging from 250° through 400° C. with two different flow rates of SiOB source gas, i.e. (1) 4 SLM and 6% $O_3$ and (2) 7 SLM and 6% $O_3$, respectively.

The data of FIG. 3 shows that with a flow rate of SiOB source gas at 7 SLM, a substrate temperature of 250° C. gives a deposition rate of about 1000 Å/minute ( hereinafter, express as "Å/min") and higher temperatures give higher deposition rates until the substrate temperature reaches 350° C. which gives the maximum deposition rate, 4000 Å/min. Thereafter, higher temperatures yield a lower deposition rate, e.g. a substrate temperature of 400° C. gives a deposition rate of about 2500 Å/min. On the other hand, when the flow rate of SiOB source gas is 4 SLM, a similar tendency is shown and a maximum deposition rate of about 2600 Å/min is obtained at the substrate temperature of 350° C.

FIG. 4 is a characteristic graph showing the dependence of the deposition rate upon the flow rate of SiOB source gas. The abscissa indicates the flow rate of SiOB source gas (SLM) and the ordinate indicates the deposition rate (Å/min). Here is shown experimental data for the dependence of the deposition rate on the flow rate of SiOB source gas, ranging from 2 to 9 SLM, the deposition temperature at 400° C. and 5.6% $O_3$.

FIG. 3 shows that a deposition rate of about 800 Å/min is obtained at 2 SLM and that the deposition rate increases sharply as the flow rate of SiOB source gas increases, until the latter reaches 6 SLM which gives a deposition rate of about 1900 Å/min. Thereafter, the deposition rate increases gradually as the flow rate increases, and about 2000 Å/min is obtained at 9 SLM.

Thus, it has been found that the method of the invention is suitable for manufacture of semiconductor devices with proper selection of gas and substrate temperature (deposition temperature) according to the graphs of FIGS. 3 and 4.

In the above-described embodiment a BSG film 14 is formed using a gas mixture of ozone ($O_3$) and a SiOB source comprising $[(CH_3)_3SiO]_3B$, but the invention is also applicable to a BSG film formed using another SiOB source. Also, the invention may be applied to a BSG film formed by methods other than the one described above. For example, the invention is applicable to a BSG film formed by a CVD technique using, as a gas mixture, TEOS+(TMB or TEB)+$O_3$ or by a CVD technique using, as a gas mixture, $SiH_4$+$B_2H_6$+$O_2$. Note "TEOS" is tetraethyl orthosilicate, "TMB" is trimethyl boron and "TEB" is triethyl boron.

Though an Al conductor layer has been described as the lower conductor layer 13, the invention is applicable to a conductor layer or an electrode comprising refractory metal, refractory metal silicide, polysilicon, polycide, or other conductor.

(2) Characteristics of a BSG film reformed by the above described method for reforming an insulating film (a) Investigations of the relative permittivity of a BSG film before and after reforming by the above described method.

Investigation of the relative permittivity of a BSG film just after each of the above steps, the BSG film having been formed at 400° C. by a CVD technique using a gas mixture consisting of a SiOB source and $O_3$, yielded the following results:

$\epsilon$=4.0 immediately after deposition.

$\epsilon$=4.5 after exposure to the air.

$\epsilon$=3.4 immediately after plasma treatment.

$\epsilon$=3.6 after one-week exposure to air after plasma treatment.

Illustrative Comparisons (1) In case of the $SiO_2$ film formed by thermal oxidation (without plasma treatment), $\epsilon$=4.0

(2) In case of the $SiO_2$ film formed at 400° C. by a CVD method using a gas mixture of TEOS and $O_3$, $\epsilon$=4.2 after exposure to air, and $\epsilon$=4.0 after plasma treatment.

Thus, the relative permittivity of a BSG film obtained by a method according to the present invention is considerably smaller as compared to that of other insulating films or that of the same BSG film without plasma treatment. A plasma treatment reduces the relative permittivity with long-lasting effectiveness.

Therefore, application of the invention to semiconductor devices enables a reduction of parasitic capacitance between conductor layers with an intervening BSG film.

(b) Investigation of the moisture content of a BSG film before and after reforming by the above-described method.

FIG. 5 shows that the moisture content of the BSG film just after deposition varies with the ratio of $O_3$ to $O_2$ and also shows the moisture content of the BSG film after plasma processing. The abscissa indicates the (%) of $O_3$ in $O_2$, and the ordinate indicates the moisture content (wt %).

A series of samples was prepared at a deposition temperature of 400° C., a flow rate of source gas at 8 SLM and percentage of $O_3$ relative to $O_2$ ranging from 1 to 5.6%. One sample was exposed to the air for 6 hours between deposition and measurement. Another sample with film deposited using 5.6% $O_3$ was treated with a plasma at a substrate temperature (reforming temperature) of 350° C. The reforming gas was $NH_3$, the flow rate of reforming gas was 400 SCCM, the gas pressure was 0.5 Torr, the RF frequency was 100 kHz, the RF power was 200 W, and the time of treatment was 3 minutes. The result was a moisture content of about 6 wt % for a film formed with 1% $O_3$. The moisture content increases until the $O_3$ percentage reaches 3%, which gave the maximum moisture content of about 6.7 wt %, and thereafter the moisture content of the BSG film formed from SiOB becomes independent of the percentage of $O_3$, that is, it becomes constant. Additionally, plasma treatment causes the moisture content to decrease sharply to 1 wt %. Thus, a plasma treatment improves the moisture content, resulting in a great improvement of characteristics and reliability of semiconductor devices.

FIG. 6 is a graph showing a change in the moisture content (wt %) of the BSG film processed with a plasma (ordinate) due to exposure to the air versus days of exposure (abscissa). The data of FIG. 6 was obtained with a deposition period of 3 minutes, a deposition temperature at 350° C., a pressure of 0.5 Torr, a reforming gas of $NH_3$ at a flow rate of 400 SCCM, and RF power at 200 W and a frequency of 100 KHz.

A seen in FIG. 6 the moisture content became about 0.9 wt % after 10 days of exposure, and thereafter increased in proportion to the elapsed time to reach 2.9 wt % after 96 days of exposure, subsequently increasing gradually with passage of time to reach 3.2 wt % after 125 days of exposure. The data shows that a change in the moisture content of the BSG film upon standing is very small as compared with that of a film formed by a conventional method so that the effect of reforming is long-lasting.

(c) Investigations of a change in stress of a BSG film obtained through the above-described method for reforming upon standing.

Figure 7:
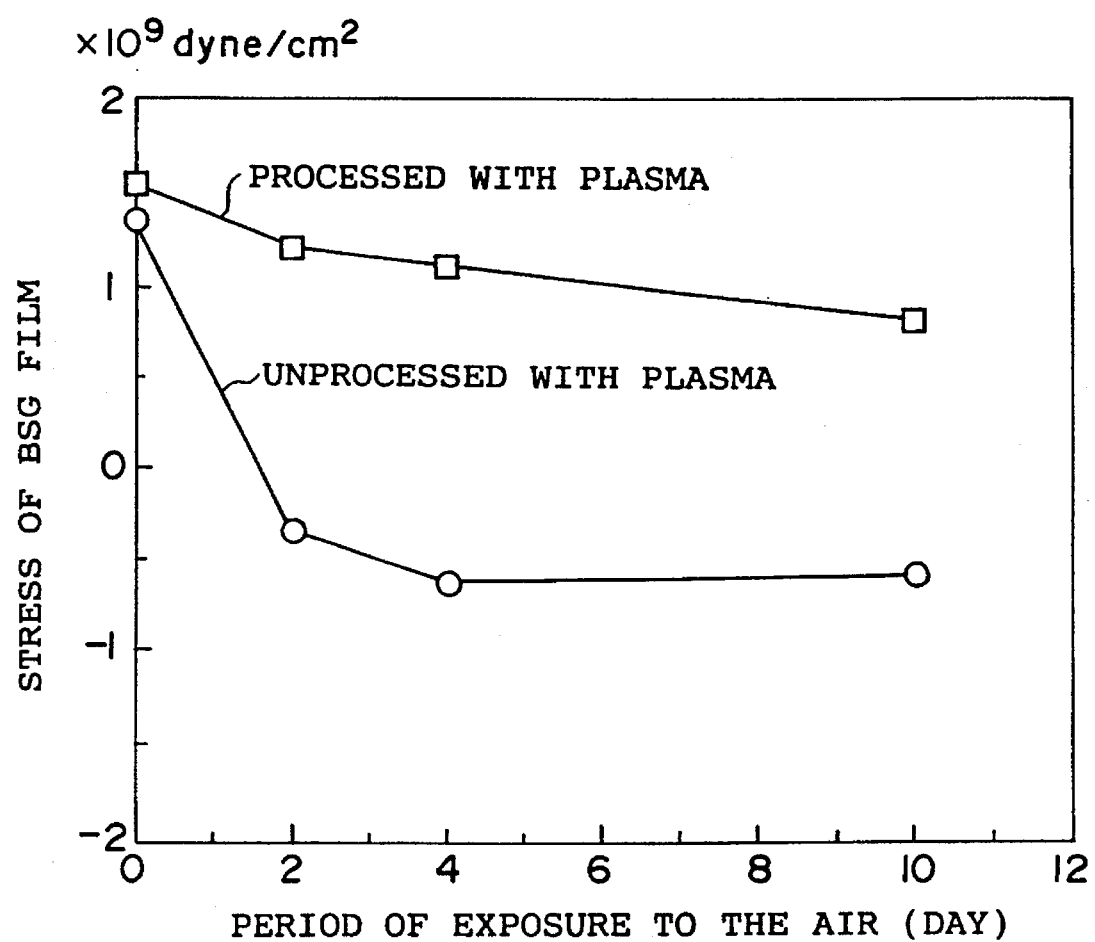
FIG. 7 is a characteristic graph showing change in stress in the BSG film due to exposure to the air after plasma treatment according to an embodiment of the invention.

FIG. 7 is a graph of change in stress in the BSG film due to exposure of the film to the air upon standing after plasma treatment. The abscissa indicates the period of exposure (days) and the ordinate indicates the stress ($\times 10^9$ $dyne/cm^2$). The data was obtained for a film formed by deposition for 3 minutes at 350° C. and a deposition rate of 3700 Å/min, with a source gas flow rate of 7 SLM and 6% $O_3$, and with plasma irradiation for 3 minutes at 350° C., at 0.5 Torr with a reforming gas of $NH_3$ at 400 SCCM, and RF power at 200 W and 100 KHz. For purposes of comparison, also presented is the change in stress of a BSG film which has not yet been reformed, upon standing.

For a sample processed with a plasma, the tensile stress is approximately 1.5 ($\times 10^9$ $dyne/cm^2$) immediately after plasma processing, which value decreases gradually with passage of time. A tensile stress of 0.8 ($\times 10^9$ $dyne/cm^2$) remains after passage of 10 days. On the other hand, in a sample not processed with a plasma, a tensile stress of approximately 1.4 ($\times 10^9$ dyne/cm2) remains immediately after plasma processing, but the stress changes greatly within a short time and changes from tensile stress to compressive stress within less than 2 days, i.e. becomes a compressive stress of about 0.4 ($\times 10^9$ dyne/cm2) after the passage of 2 days. Thereafter, the stress remains substantially unchanged with the passage of time and a compressive stress of about 0.6 ($\times 10^9$ dyne/cm2) remains after the passage of 10 days. These values show that plasma processing reduces the change in stress. This reflects a reduction in the moisture content of the film.

Thus, by reforming a BSG film according to the present invention, the moisture content and hence the relative permittivity of a BSG film can be reduced. Additionally, since absorption of moisture after film formation can be prevented, good performance of a film obtained through plasma processing can be long maintained.

Therefore, when the present invention is applied to a semiconductor device, parasitic capacitance between conductor layers with an intervening BSG film is reduced resulting in the improvement of characteristics and reliability.

Further, plasma irradiation of a film on a substrate at elevated temperature increases the effect of reforming. Additionally, a low temperature below 500° C. provides sufficient reforming to make the invention suitable for processing of an interlayer insulating film covering Al etc.

What is claimed is:

1. A method for forming a reformed insulating film on a substrate, comprising the steps of:

contacting the substrate with a deposition gas, containing a gaseous organometallic compound having Si—O—B bonds, to deposit a borosilicate glass film on the substrate; and contacting said borosilicate glass film with a plasma gas to reduce the moisture content and relative permittivity of said borosilicate glass film.

2. The method defined in claim 1 wherein said plasma gas is a plasma formed from at least one gas selected from the group consisting of oxygen, ammonia and inert gases.

3. The method defined in claim 1 wherein said plasma is made by applying RF power at a frequency from 100 KHz to 13.56 MHz and at 600 watts or lower to electrodes facing each other.

4. The method defined in claim 1 wherein the substrate is held at a temperature of 500° C. or lower during said contacting.

5. The method defined in claim 1 wherein said deposition gas is a gas mixture consisting of ozone and said organometallic compound.

6. The method defined in claim 1 wherein said deposition gas is a gas mixture consisting of ozone, tetraethylorthosilicate and said organometallic compound.

7. The method defined in claim 1 wherein said organometallic compound is represented by the general formula:

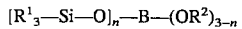

$$[R^1_3\text{—Si—O}]_n\text{—B—}(OR^2)_{3-n}$$

where n=1, 2, 3, and each of $R^1$ and $R^2$ is selected from the group consisting of the alkyl and aryl.

8. The method defined in claim 1 wherein said substrate is held at a temperature of 400° C. or lower during said contacting.

9. The method defined in claim 1 further comprising forming an interconnection layer on each side of said borosilicate glass film.

10. The method defined in claim 9 wherein at least one of said interconnection layers is an Al or Al alloy film.

* * * * *

UNITED STATES PATENT AND TRADEMARK OFFICE
CERTIFICATE OF CORRECTION

PATENT NO. : 5,569,499
DATED : October 29, 1996
INVENTOR(S) : MAEDA et al

It is certified that error appears in the above-indentified patent and that said Letters Patent is hereby corrected as shown below:

Col. 1, line 60, "SiDBN" should read --SiBN--.
Col. 3, line 56, "($C_6H_5$)" should read --($C_6H_5$-)--.

Signed and Sealed this

Fifth Day of August, 1997

Attest:

BRUCE LEHMAN

Attesting Officer    Commissioner of Patents and Trademarks